(12) United States Patent
Greim et al.

(10) Patent No.: US 7,570,059 B2
(45) Date of Patent: Aug. 4, 2009

(54) DOUBLE RESONANCE COIL ARRANGEMENT FOR A MAGNETIC RESONANCE DEVICE

(75) Inventors: Helmut Greim, Adelsdorf (DE); Volker Matschi, Knoxville, TN (US)

(73) Assignee: Siemens Aktiengesellschaft, Munich (DE)

( * ) Notice: Subject to any disclaimer, the term of this patent is extended or adjusted under 35 U.S.C. 154(b) by 48 days.

(21) Appl. No.: 11/756,788

(22) Filed: Jun. 1, 2007

(65) Prior Publication Data

US 2007/0279062 A1 Dec. 6, 2007

(30) Foreign Application Priority Data

Jun. 2, 2006 (DE) ............ 10 2006 025 941

(51) Int. Cl.
*G01V 3/00* (2006.01)
(52) U.S. Cl. ..................... 324/322
(58) Field of Classification Search ......... 324/300–322; 600/410–435; 333/219–235; 343/701, 725–730, 343/893
See application file for complete search history.

(56) References Cited

U.S. PATENT DOCUMENTS

| 4,742,304 | A | 5/1988 | Schnall et al. |
| 5,572,128 | A | 11/1996 | Kess |
| 6,822,450 | B2 * | 11/2004 | Klinge et al. ............ 324/318 |
| 6,879,159 | B2 | 4/2005 | Yoshida |
| 2001/0033165 | A1 | 10/2001 | Tomanek et al. |
| 2005/0174116 | A1 * | 8/2005 | Leussler et al. ......... 324/318 |
| 2007/0085634 | A1 * | 4/2007 | Du et al. .............. 333/219.2 |

OTHER PUBLICATIONS

Patent Abstracts of Japan Publication No. 06242202.

* cited by examiner

*Primary Examiner*—Brij B. Shrivastav
*Assistant Examiner*—Dixomara Vargas
(74) *Attorney, Agent, or Firm*—Schiff Hardin LLP

(57) ABSTRACT

A double resonance coil arrangement for a magnetic resonance device has at least two coils, each having a coil conductor, in which at least one first capacitor, as well as at least one inductor forming an oscillating circuit with a second capacitor, are connected. The inductors of two adjacently arranged coils are at a distance from one another and form a transformer. The capacitors, the inductor and the distance are dimensioned such that each coil is double resonant and the at least two coils are decoupled from each other by the transformer.

7 Claims, 4 Drawing Sheets

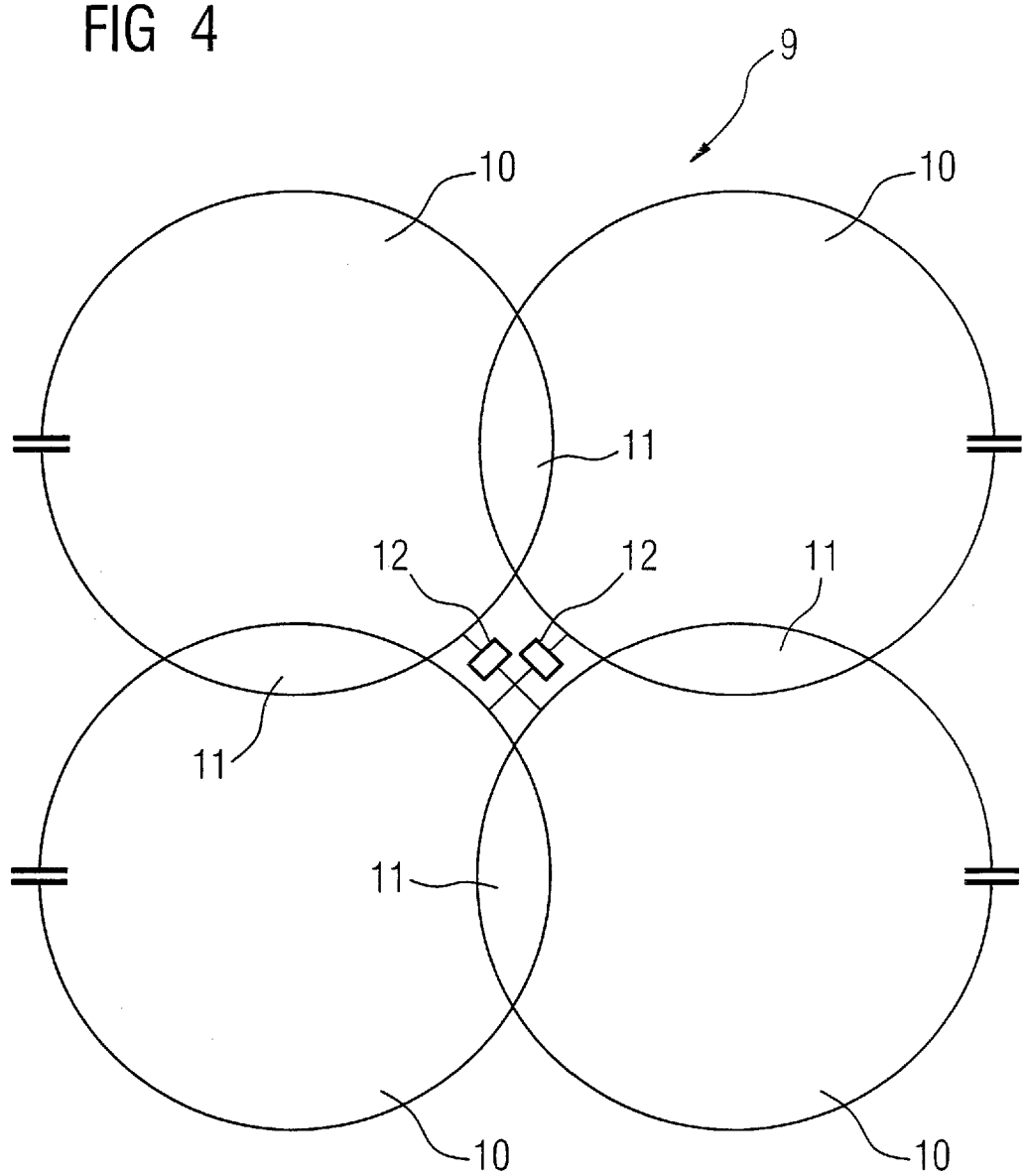

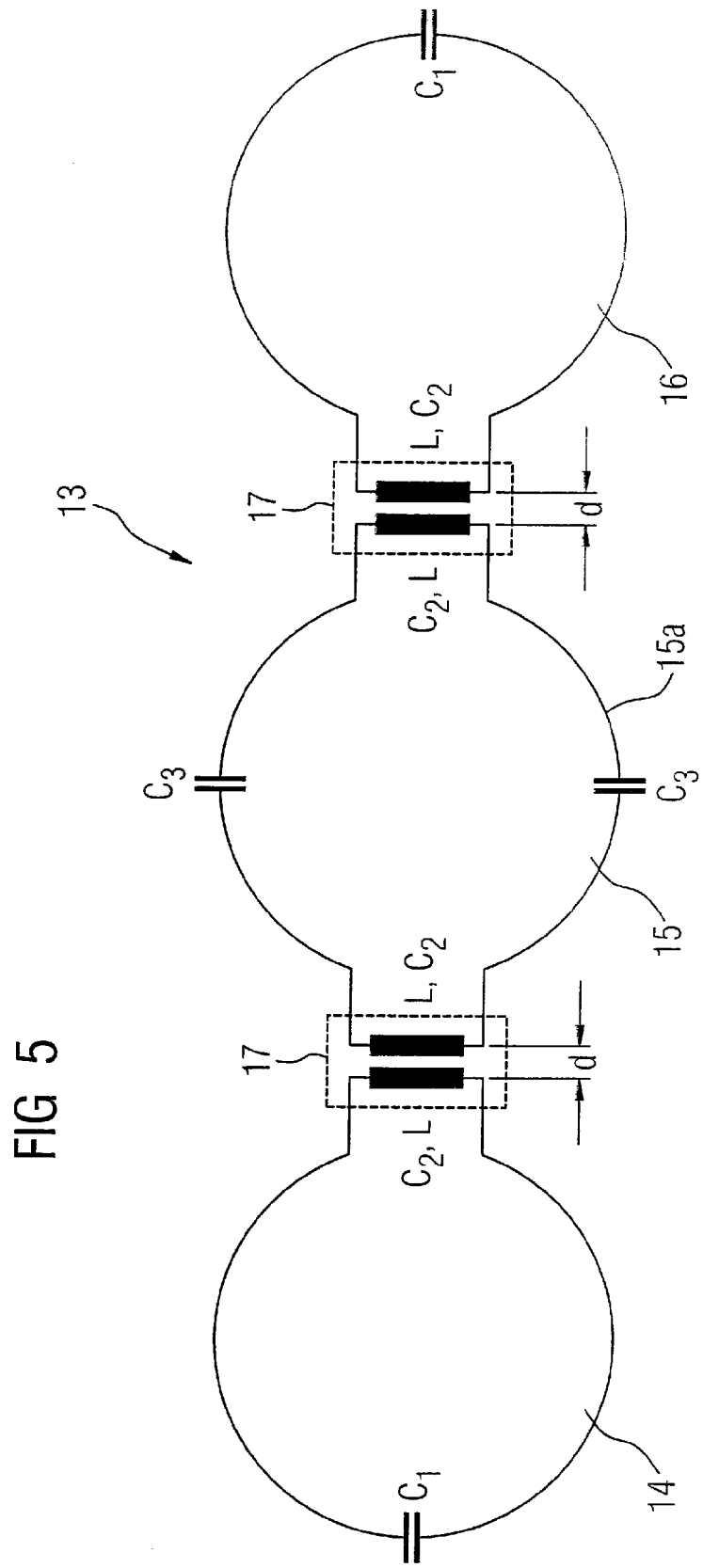

DOUBLE RESONANCE COIL ARRANGEMENT FOR A MAGNETIC RESONANCE DEVICE

BACKGROUND OF THE INVENTION

1. Field of the Invention

The present invention relates to a double resonance coil arrangement for a magnetic resonance device of the type having at least two coils, each formed by a coil conductor in which at least one capacitor as well as at least one inductor forming an oscillating circuit with a further second capacitor are connected.

2. Description of the Prior Art

If, for magnetic resonance data acquisition, nuclei other than hydrogen are to be excited and their signals received, for the purpose of spectroscopy or imaging for instance, it is advantageous to employ a detection coil arrangement that is sensitive both to hydrogen nuclei as well as to other types of nuclei (called X-nuclei below). It is then possible for instance to firstly re-cord a hydrogen overview image for localization purposes and then to execute X-nuclei spectroscopy or X-nuclei image data acquisition for instance. Such coil arrangements with two discrete resonance frequencies are known as double resonant coil arrangements.

To obtain a double resonant coil, it is known to connect an inductor having a second capacitor (i.e., in addition to the "already" present first capacitor) arranged in parallel thereto in the coil conductor. This generates an oscillating circuit, which acts in addition to the oscillating circuit formed from the coil conductor itself and the first capacitor.

Several coils are usually used in a coil arrangement. Decoupling techniques are known in order to decouple these coils from one another so that said coils do not mutually influence one another. It is known to geometrically decouple coils. To this end, a specific overlap between adjacent coils is generated, which is measured such that the magnetic flow permeating through the overlap region offsets the magnetic flow generated in the other regions by the other coils in each instance. Galvanic decoupling arrangements are also known. In this way, the galvanic components, for instance inductive components, are used between the coils. The galvanic decoupling arrangement nevertheless functions properly only in a very narrow frequency band, so such a decoupling arrangement can be realized only for one frequency. In addition, a complicated balancing process for the final decoupling is necessary. Lastly, decoupling by means of transformers is known. Transformers enable coils to be decoupled without a direct connection.

If decoupling by transformers is used with a double resonant coil arrangement, additional components are needed to generate the double resonance and also for de-coupling purposes. This adversely affects the quality of the coils. The open circuit-load quality ratio has a direct impact on the signal-to-noise ratio of the coil.

SUMMARY OF THE INVENTION

An object of the invention is to provide a double resonance coil arrangement, which exhibits a higher coil quality in the case of decoupled coils.

This object is achieved in accordance with the invention by a double resonance coil arrangement of the type initially described wherein the inductors, which are arranged at a distance from one another, of two adjacent coils form a transformer, and the capacitors, the inductor and the distance of the inductors are dimensioned such that each coil is double resonant and at least two coils are decoupled from each other by the transformer formed by the inductors.

Thus, in accordance with the invention the inductors that are used to generate the double resonance to simultaneously form a transformer, which decouples the coils from one another. One component is thus used for two different purposes, so that fewer total components are required. The required space also is advantageously reduced and lower costs are achieved. In addition fewer sources of error are present.

By reducing the number of components used, the quality of the individual coils is additionally increased, since a higher signal-to-noise ratio is obtained. The coil arrangement according to the invention still enables the same signal-to-noise ratio to be achieved with hydrogen image recordings, as would be possible with a purely singly resonant hydrogen coil arrangement. The decoupling by the transformer has the additional advantage that neither a direct connection nor an overlap at the decoupled points is necessary, so that double resonant coils can also be used in regions in which an overlap (geometric decoupling) is not possible for certain specific designs. One example of this is a head coil arrangement. Head coil arrangements generally are formed by at least two housing parts that are separated from one another, between which conductive connections can only be realized with difficulty.

In accordance with the invention, the capacitors, the inductor and the distance are dimensioned such that each coil is double resonant and at least two coils are decoupled from each other by means of the transformer. To this end, it is necessary to match the different components to one another. It is noted that by adding the inductor, which is usually realized by coil, different resonance frequencies are produced for a stand-alone coil than in the inventive case, in which two inductors are combined to form a transformer. Another adjustment is then needed here to achieve the desired resonance frequencies.

Different possibilities exist for the composition of the second capacitor. The second capacitor can be formed by the self-capacitance of the inductor. No further component, for instance a further discrete capacitor, is then necessary, but the self-capacitance of the already-connected inductor is instead used. Each inductor acts itself as an oscillating circuit by virtue of its self-capacitance. The result is that a further component is not needed.

It is also possible for the second capacitor to be formed by the self-capacitance of the inductor and at least one discrete capacitor that is connected in parallel with the inductor. An additional component is still interconnected here in order to further adjust the second capacitor, this enabling a more precise dimensioning of the second capacitor.

To achieve an improved symmetry of the circuitry as well in the case of symmetrical arrangements and thus to enable an easier matching, the first capacitor and/or the second capacitor can be dimensioned identically in each instance.

The distance and/or the inductor and/or the capacitors can be changed with particular advantage. It is then possible to carry out a fine tuning and/or to adjust other resonance frequencies of the double resonance, even after terminating the setting up of the double resonance coil arrangement.

If the double resonance coil arrangement has more than two coils, the decoupling arrangement used can be combined with other decoupling arrangement types by means of transformers. The decoupling arrangement can be partially realized for instance by a geometrical decoupling arrangement and partially realized by a decoupling arrangement by transformers. This can be advantageously used when at least four coils arranged in the form of a matrix are provided. Horizontally and vertically adjacent coils then can be decoupled by an overlap and diagonally adjacent coils can be decoupled by a transformer.

It is generally also possible for a number of inductors with second capacitors to be connected in a single coil conductor if a coil is to be decoupled with a number of coils by way of transformers. This is necessary, for instance, if three adjacent coils are to be decoupled from one another. The middle of the three coils then features two connected inductors in its coil conductor, whereas only one inductor is connected in the coil conductor of the outer coils.

DESCRIPTION OF THE DRAWINGS

FIG. 4 shows the significantly simplified schematic diagram of a double resonance coil arrangement according to a third exemplary embodiment of the invention.

FIG. 5 is a circuit diagram of a double resonance coil arrangement according to a fourth exemplary embodiment of the invention.

DESCRIPTION OF THE PREFERRED EMBODIMENTS

Figure 1:
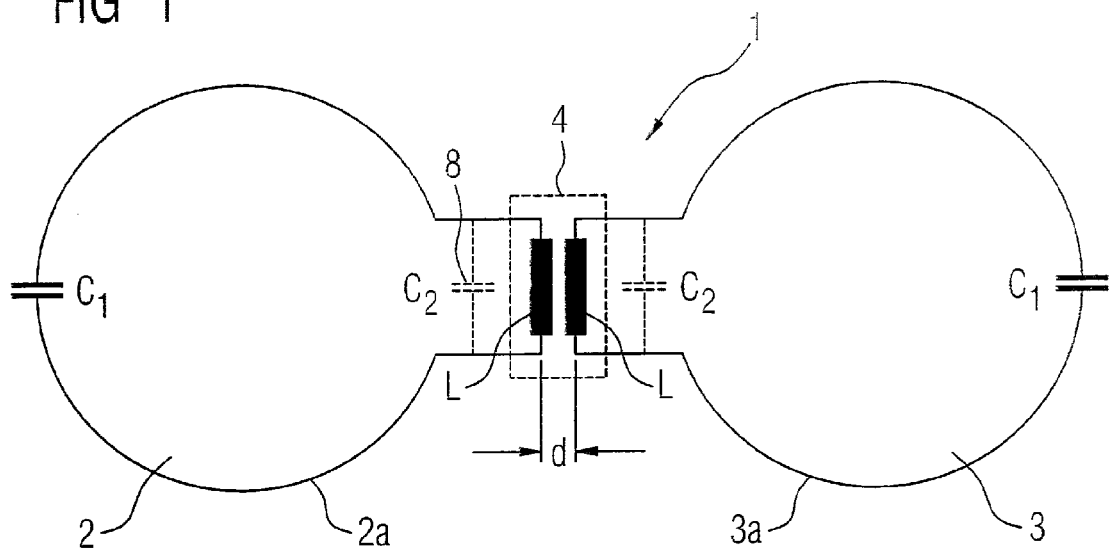
FIG. 1 is a circuit diagram of a double resonance coil arrangement according to a first exemplary embodiment of the invention.

FIG. 1 shows the schematic diagram of a double resonance coil arrangement 1, which here has two coils 2 and 3. A first capacitor is C1 is connected in each instance in each of the coil conductors 2a, 3a. In addition, an inductor L is also connected in each instance in the coil conductors 2a and 3a. The two inductors L together form a transformer 4. They are distanced here by a distance d. The coils 2 and 3 are decoupled from one another by the transformer 4.

Each of the inductors L additionally embodies a self-capacitance 8, which is indicated here with a dashed line. This forms the second capacitor $C_2$, which, together with the inductor L, forms an oscillating circuit.

The capacitors $C_1$, $C_2$, the inductor L and the distance d are dimensioned here such that each coil 2, 3 with the same frequencies is double resonant and the coils 2, 3 are decoupled among themselves by the transformer 4.

Figure 2:
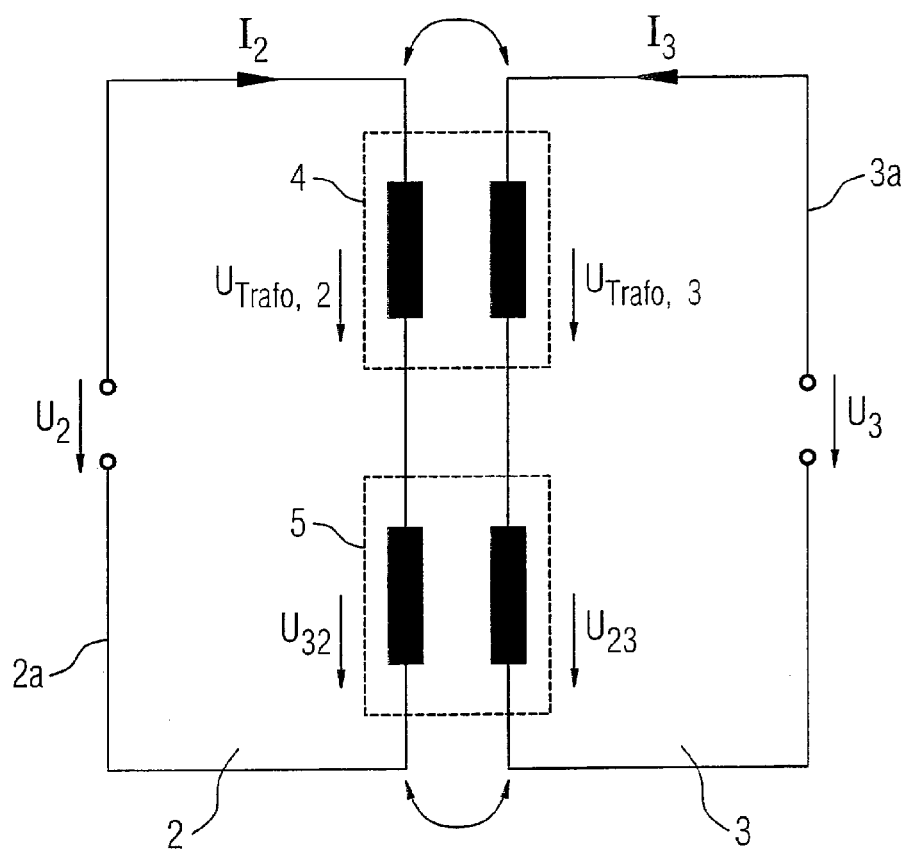
FIG. 2 shows a significantly simplified equivalent schematic diagram of the transformer decoupling arrangement from FIG. 1.

The principle of the decoupling arrangement by way of a trans-former can be more precisely seen from the equivalent circuit diagram in FIG. 2. If the coils 2, 3 send or receive or send, a current $I_2$ and/or $I_3$ flows in the coil conductors 2a, 3a. A voltage $U_2$ and a voltage $U_3$ are tapped at the signal pick-up point. The two coils 2, 3 as such form together a transformer 5, in other words, the current 12 induces a voltage in the coil 3, said voltage being referred to here as $U_{23}$. The same naturally applies to the current $I_3$, which induces a voltage $U_{32}$ in the coil 2. The double resonance coil arrangement 1 also comprises the transformer 4. In this, a voltage $U_{Trafo}$, 2 and/or $U_{Trafo}$, 3 is likewise generated by the respective currents. The condition $U_{23}+U_{Trafo}, 3=0$ and/or $U_{32}+U_{Trafo}, 2=0$ needs to be fulfilled in order for the coils 2, 3 to be decoupled. This condition is frequency-independent.

The capacitors $C_1$ and $C_2$, the inductors L and the distance d are designed such that this condition is fulfilled and both coils are simultaneously double resonant.

Figure 3:
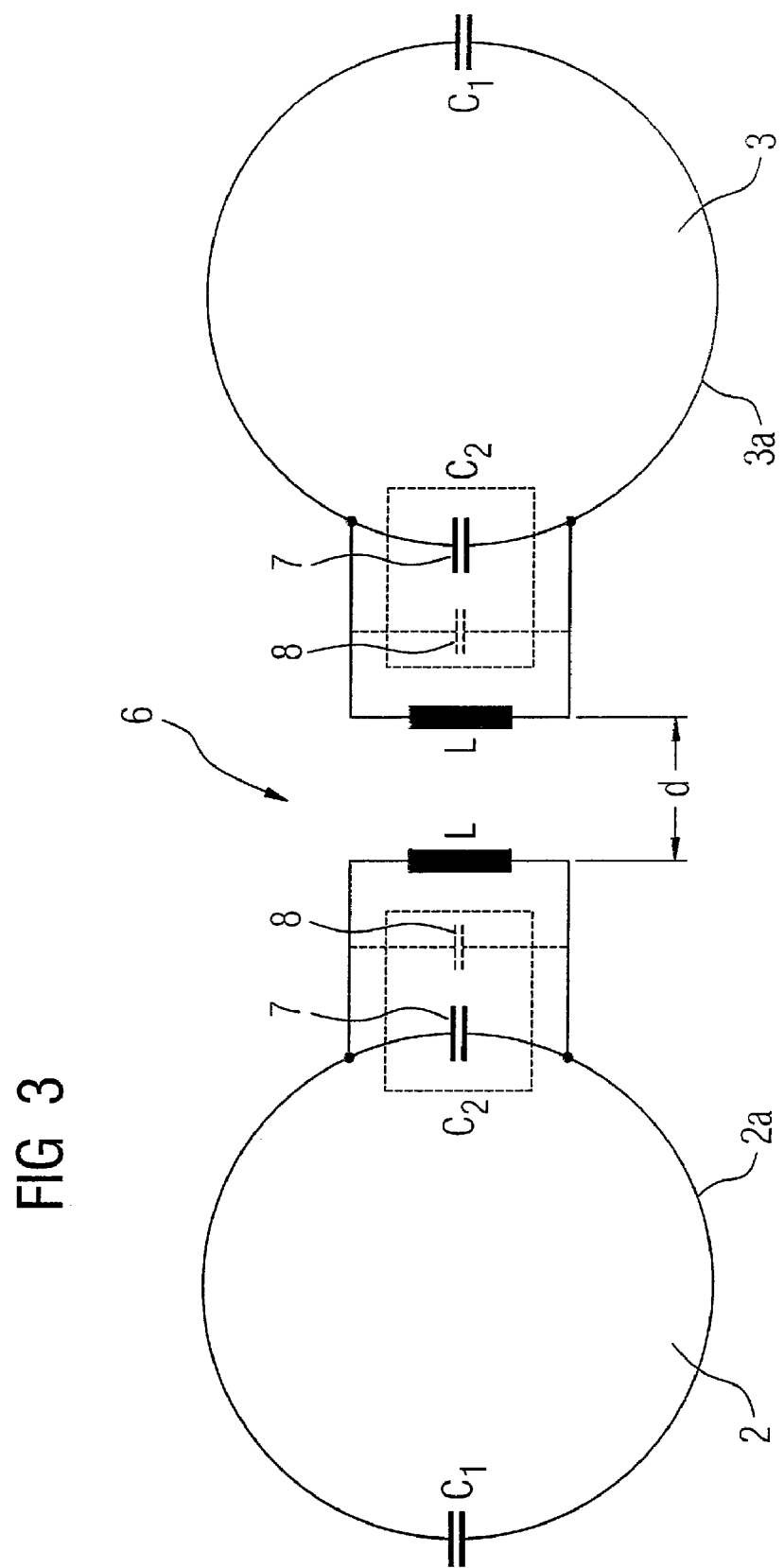
FIG. 3 is a circuit diagram of a double resonance coil arrangement according to a second exemplary embodiment of the invention.

FIG. 3 shows a second exemplary embodiment of a double resonance coil arrangement 6. In addition to the first capacitor $C_1$, a further capacitor L, which is connected in parallel with the inductor L, is connected in the coil conductors 2a, 3a of the coils 2, 3, in contrast with the first exemplary embodiment. The second capacitor $C_2$ is formed here from the capacitor 7 and the self-capacitance 8 of the inductor L. The capacitors $C_1$, $C_2$, the inductors L and the distance d are in turn dimensioned such that both coils 2, 3 are double resonant and are decoupled from one another.

FIG. 4 shows the simplified schematic diagram of a double resonance coil arrangement 9 with four coils 10 arranged in the form of a matrix. In this way, vertically or horizontally adjacent coils are geometrically decoupled in each instance by an overlap 11. Diagonally adjacent coils are decoupled in each instance by way of a transformer 12 described above, which is only shown here in principle for clarity. Each transformer 12 is formed here in turn from inductors L, which are both part of the transformer 12 and are also used to de-couple the diagonally adjacent coils 10 from one another. Accordingly, the capacitors, the inductors and the distances between the inductors are measured here such that all coils 10 are decoupled from another and all coils 10 are double resonant with the same two frequencies.

FIG. 5 shows a fourth exemplary embodiment of a double resonance coil arrangement 13, which, in this case, comprises three coils 14, 15 and 16. Two inductors L are connected in the coil conductor 15a of the middle coil 15a so that all coils can be decoupled by a capacitor 17 composed of two inductors L with a self-capacitance $C_2$. In addition, two capacitors $C_3$ are connected in the middle coil converter, said two capacitors differing from the capacitors $C_1$ connected in the external coil conductors 14, 16. The capacitors $C_1$, and $C_3$, the self capacitance $C_2$, the inductors L and the distances d are also dimensioned in this exemplary embodiment such that each coil 14, 15, 16 is double resonant with the same frequencies and the coils 14, 15, 16 are decoupled among themselves by the transformers 17.

In all exemplary embodiments, it is possible to use variable capacitors and/or variable inductors (variometers). It is also possible for the distance between the inductors in the transformer to be changeable. A fine tuning of the double resonance and/or decoupling arrangement and also an adjustment to different frequencies for instance is then possible.

Although modifications and changes may be suggested by those skilled in the art, it is the intention of the inventors to embody within the patent warranted hereon all changes and modifications as reasonably and properly come within the scope of their contribution to the art.

We claim as our invention:

1. A double resonance coil arrangement for a magnetic resonance apparatus, comprising:
   at least two coils, each of said coils comprising a coil conductor with a first capacitor connected therein, and an inductor connected with a second capacitor therein to form an oscillating circuit, the at least two coils being disposed adjacent to each other with said inductors being disposed at a distance from each other; and
   said distance between said inductors being dimensioned to make said inductors form a transformer, and said distance, the respective inductors, the respective first capacitors, and the respective second capacitors being dimensioned to make each of said at least two coils double resonant, with said at least two coils decoupled from each other by said transformer.

2. A double resonant coil arrangement as claimed in claim 1 wherein each inductor has a self capacitance that forms the second capacitor for the coil containing that inductor.

3. A double resonant coil arrangement as claimed in claim 1 wherein each of said inductors has a self capacitance, and wherein each second capacitor is formed by the self-capacitance of the inductor and at least one discrete capacitor connected in parallel with the inductor.

4. A double resonant coil arrangement as claimed in claim 1 wherein the respective second capacitors have identical dimensions.

5. A double resonant coil arrangement as claimed in claim 1 wherein the respective first capacitors have identical dimensions.

6. A double resonant coil arrangement as claimed in claim 1 wherein at least one of said distance, said inductors, the respective first capacitors and the respective second capacitors is adjustable.

7. A double resonant coil arrangement as claimed in claim 1 comprising at least four coils arranged as a matrix, with horizontally and vertically adjacent coils in the matrix being decoupled by an overlapping of those coils, and diagonally adjacent coils in the matrix being decoupled by said transformer.

* * * * *